United States Patent
Ohashi

(10) Patent No.: US 10,319,897 B2
(45) Date of Patent: Jun. 11, 2019

(54) ULTRASONIC SENSOR AND MANUFACTURING METHOD FOR THE SAME

(71) Applicant: Seiko Epson Corporation, Tokyo (JP)

(72) Inventor: Koji Ohashi, Matsumoto (JP)

(73) Assignee: Seiko Epson Corporation (JP)

( * ) Notice: Subject to any disclaimer, the term of this patent is extended or adjusted under 35 U.S.C. 154(b) by 258 days.

(21) Appl. No.: 15/078,098

(22) Filed: Mar. 23, 2016

(65) Prior Publication Data
US 2016/0284973 A1    Sep. 29, 2016

(30) Foreign Application Priority Data
Mar. 25, 2015  (JP) ................. 2015-063324

(51) Int. Cl.
| | |
|---|---|
| H01L 41/113 | (2006.01) |
| B06B 1/06 | (2006.01) |
| H01L 41/08 | (2006.01) |
| H01L 41/314 | (2013.01) |
| H01L 41/33 | (2013.01) |

(52) U.S. Cl.
CPC ........ *H01L 41/1132* (2013.01); *B06B 1/0644* (2013.01); *H01L 41/0815* (2013.01); *H01L 41/314* (2013.01); *H01L 41/33* (2013.01)

(58) Field of Classification Search
CPC ............. H01L 41/1132; H01L 41/0815; H01L 41/314; H01L 41/33; B06B 1/0618; B06B 3/00; B06B 1/0644
USPC .......................................... 310/334
See application file for complete search history.

(56) References Cited

U.S. PATENT DOCUMENTS

| | | | | |
|---|---|---|---|---|
| 6,241,346 B1* | 6/2001 | Takahashi | ............ | B41J 2/14274 |
| | | | | 310/328 |
| 2010/0156238 A1* | 6/2010 | Kim | ............ | H04R 17/00 |
| | | | | 310/322 |
| 2011/0115337 A1* | 5/2011 | Nakamura | ............ | G10K 9/122 |
| | | | | 310/334 |
| 2013/0258802 A1 | 10/2013 | Nakamura et al. | | |
| 2014/0241112 A1 | 8/2014 | Kano | | |
| 2014/0292148 A1* | 10/2014 | Nakamura | ............ | B06B 1/067 |
| | | | | 310/334 |

(Continued)

FOREIGN PATENT DOCUMENTS

| | | |
|---|---|---|
| JP | H11-056857 A | 3/1999 |
| JP | 2003-284182 A | 10/2003 |

(Continued)

*Primary Examiner* — Bryan P Gordon
(74) *Attorney, Agent, or Firm* — Harness, Dickey & Pierce, P.L.C.

(57) ABSTRACT

An ultrasonic sensor includes: when two orthogonal axes are referred to as an X axis and a Y axis and a plane formed by the X axis and the Y axis is referred to as an XY plane, a substrate disposed across the XY plane; a plurality of spaces formed in the substrate in at least one direction of an X-axis direction and a Y-axis direction; a vibrating plate that is provided on the substrate such that the spaces are closed and that has a first surface on the substrate side and a second surface facing the first surface; and a piezoelectric element that is provided at a portion on the second surface side of the vibrating plate that corresponds to the space, and that transmits/receives an ultrasonic wave. At least some of the spaces are arranged to form a zigzag shape.

6 Claims, 12 Drawing Sheets

(56) References Cited

U.S. PATENT DOCUMENTS

2015/0187347 A1\* 7/2015 Kojima ............... G01S 15/8915
  310/322

FOREIGN PATENT DOCUMENTS

| JP | 2004-105257 A | 4/2004 |
|----|---------------|--------|
| JP | 2011-255024 A | 12/2011 |
| JP | 2011-259274 A | 12/2011 |
| JP | 2012-117825 A | 6/2012 |
| JP | 2013-211604 A | 10/2013 |
| JP | 2014-161707 A | 9/2014 |

\* cited by examiner

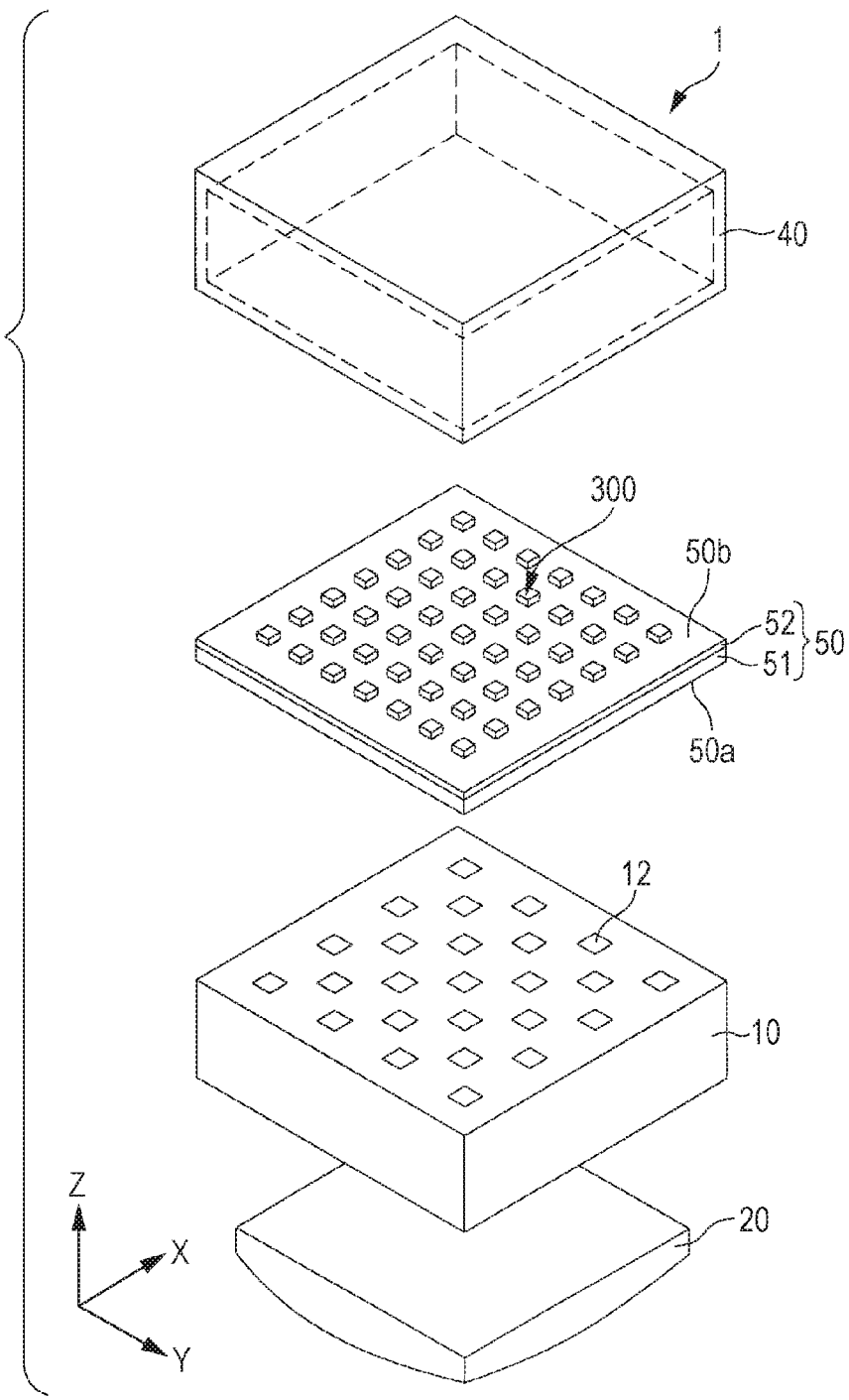

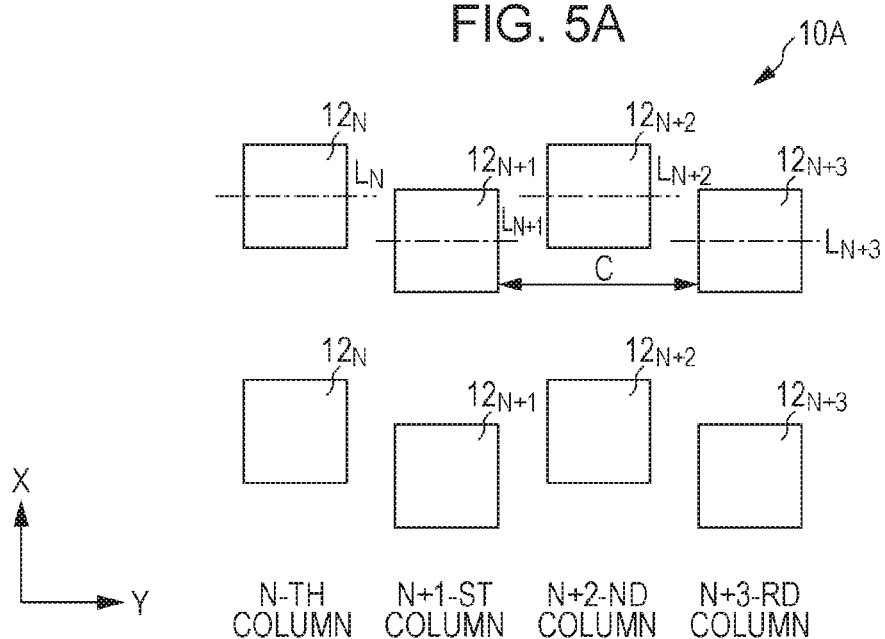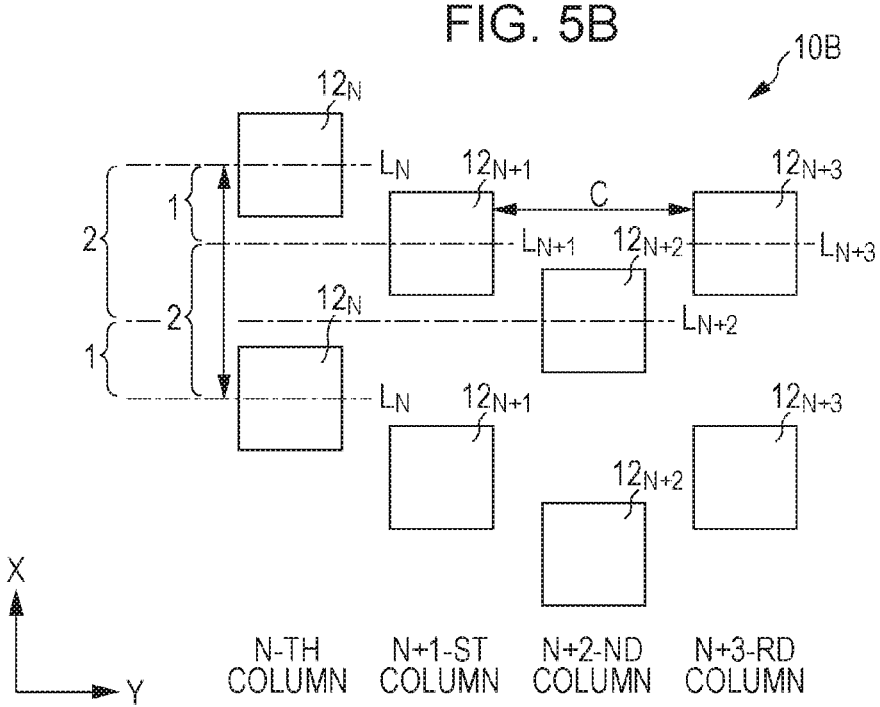

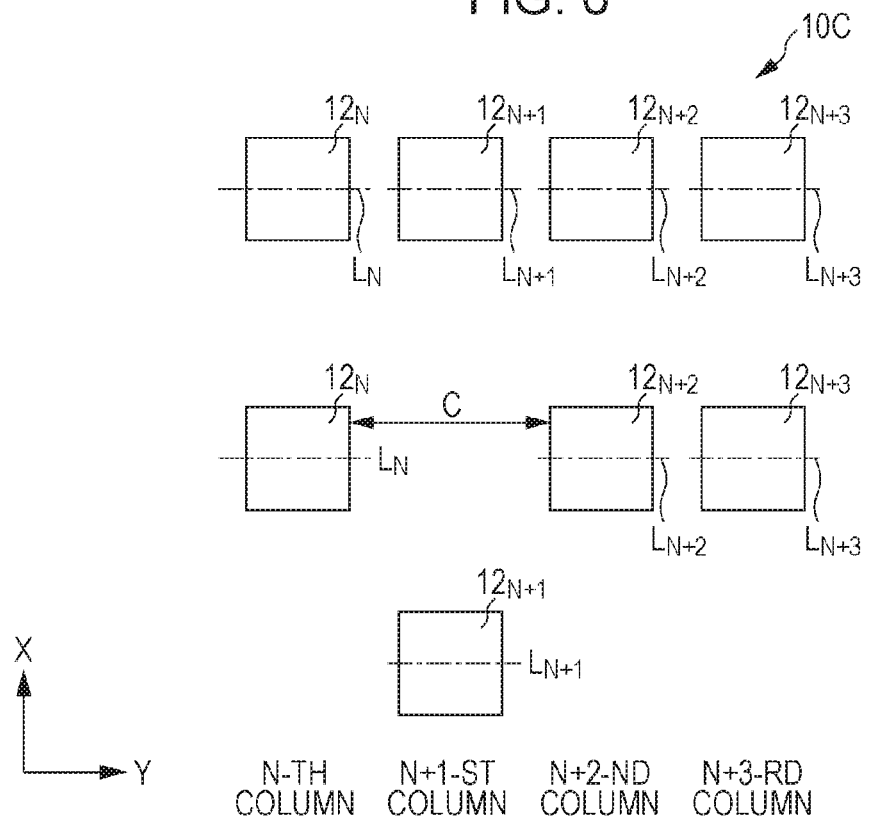

CONFIGURATION 1 IN THE RELATED ART

CONFIGURATION 2 IN THE RELATED ART

ULTRASONIC SENSOR AND MANUFACTURING METHOD FOR THE SAME

BACKGROUND

1. Technical Field

The present invention relates to an ultrasonic sensor and a manufacturing method for the ultrasonic sensor.

2. Related Art

In the related art, there is an ultrasonic sensor in which electromechanical conversion characteristics of a piezoelectric element are employed. For example, there is an ultrasonic sensor that includes a support member (a substrate disposed across an XY plane formed by an X axis and a Y axis), a movable film (vibrating plate) provided on the substrate, an electromechanical conversion element (piezoelectric element) provided on the vibrating plate, and an opening (space) formed in the substrate on a side of the vibrating plate, which is opposite to the piezoelectric element (see JP-A-2011-255024 (paragraph [0047], FIG. 5, and the like) and JP-A-2011-259274 (paragraph [0044], FIG. 5, and the like)). In both JP-A-2011-255024 and JP-A-2011-259274, ultrasonic sensor elements that include the piezoelectric element, the vibrating plate, and the space, as described above, are adjacent at regular intervals so as to form a lattice extending along the X-axis and the Y-axis.

In this type of ultrasonic sensor, an ultrasonic wave is transmitted and received in response to displacement of the piezoelectric element of the ultrasonic sensor element. The possibility to enhance displacement characteristics of the piezoelectric element is useful for enhancing the efficiency of transmission and reception of the ultrasonic wave and, eventually, for enhancing the sonic characteristics.

However, in recent years, there has been a demand for ultrasonic sensor elements having a high-density arrangement; on the other hand, in JP-A-2011-255024 and JP-A-2011-259274, a problem arises in that it is difficult to maintain good sonic characteristics while achieving a high-density arrangement of the ultrasonic sensor elements.

In other words, in JP-A-2011-255024 and JP-A-2011-259274, since the ultrasonic sensor elements are adjacent at regular intervals so as to form a lattice extending in the X-axis direction and the Y-axis direction, it is not possible to ensure a sufficient wall thickness for the space in the ultrasonic sensor element. In this case, the entire substrate is likely to be influenced by the displacement of individual piezoelectric elements and, thus, there is a possibility that the displacement of individual piezoelectric elements will cause overall bending (structural crosstalk) of the vibrating plate.

When the occurrence of the structural crosstalk described above causes variation in the displacement characteristics of the individual piezoelectric elements, the efficiency in the displacement of the entire piezoelectric elements thus deteriorates and, as a result, the sonic characteristics are likely to deteriorate. Such problems arise not only in the ultrasonic sensors disclosed in JP-A-2011-255024 and JP-A-2011-259274, but also in ultrasonic sensors in which electromechanical conversion characteristics of the piezoelectric element are employed.

SUMMARY

An advantage of some aspects of the invention is to provide an ultrasonic sensor and a manufacturing method for the ultrasonic sensor in which it is possible to maintain good sonic characteristics while achieving a high-density arrangement of ultrasonic sensor elements.

According to an aspect of the invention, an ultrasonic sensor includes: when two orthogonal axes are referred to as an X axis and a Y axis and a plane formed by the X axis and the Y axis is referred to as an XY plane, a substrate disposed across the XY plane; a plurality of spaces formed in the substrate in at least one direction of an X-axis direction and a Y-axis direction; a vibrating plate that is provided on the substrate such that the spaces are enclosed and that has a first surface on the substrate side and a second surface facing the first surface; and a piezoelectric element that is provided at a portion on the second surface side of the vibrating plate, which corresponds to the space, and that transmits/receives an ultrasonic wave. At least some of the spaces are arranged to form a zigzag shape. In this case, it is possible to ensure a sufficient wall thickness in the portion where the spaces are arranged to form the zigzag shape. Therefore, it is possible to suppress the influence of the displacement of the individual piezoelectric element on the entire substrate and, thus, it is possible to prevent the occurrence of the structural crosstalk described above, even in a case where the ultrasonic sensor elements collectively have a high-density arrangement. Hence, it is possible to maintain good sonic characteristics while achieving a high-density arrangement of the ultrasonic sensor elements.

In the ultrasonic sensor, it is preferable that the piezoelectric element be configured to have a first electrode, a piezoelectric layer on the first electrode, and a second electrode on the piezoelectric layer, the first electrode is an individual electrode used to drive each column or each set of a plurality of columns in the X-axis direction, the second electrode is a common electrode which is common to each row extending in the Y-axis direction, and at least some of the spaces are formed at pitches shifted in the X-axis direction. In this case, the spaces are arranged at shifted pitches in a direction in which the first electrode extends as the individual electrode. In other words, in this case, it is easy to arrange the first electrodes in the portions on the second surface side of the vibrating plate that correspond to the spaces. Hence, it is easy to configure the ultrasonic sensor in which it is possible to maintain good sonic characteristics while achieving a high-density arrangement of the ultrasonic sensor elements.

In the ultrasonic sensor, it is preferable that spaces on one side in the Y-axis direction from the spaces formed at pitches shifted in the X-axis direction be juxtaposed through diaphragms disposed in a first direction, and, when a virtual line is drawn in the Y-axis direction so as to pass through the centers of the spaces formed at pitches shifted in the X-axis direction, the virtual line passes through the diaphragm. In this case, it is possible to ensure a suitable wall thickness for the spaces in the portion in which the spaces are arranged to form a zigzag shape. Hence, it is possible to maintain good sonic characteristics while achieving a high-density arrangement of the ultrasonic sensor elements.

According to another aspect of manufacturing method for an ultrasonic sensor includes: when two orthogonal axes are referred to as an X axis and a Y axis and a plane formed by the X axis and the Y axis is referred to as an XY plane, a substrate disposed across the XY plane; a plurality of spaces formed in the substrate in at least one direction of an X-axis direction and a Y-axis direction; a vibrating plate that is provided on the substrate such that the spaces are closed and that has a first surface on the substrate side and a second surface facing the first surface; and a piezoelectric element that is provided at a portion on the second surface side of the vibrating plate, which corresponds to the space, and that transmits/receives an ultrasonic wave, the manufacturing method includes: arranging at least some of the spaces to form a zigzag shape. In this case, it is possible to manufacture an ultrasonic sensor in which it is possible to maintain good sonic characteristics while achieving a high-density arrangement of the ultrasonic sensor elements.

BRIEF DESCRIPTION OF THE DRAWINGS

The invention will be described with reference to the accompanying drawings, wherein like numbers reference like elements.

FIG. 2 is an exploded perspective view illustrating a configurational example of an ultrasonic sensor.

FIGS. 5A and 5B are plan views illustrating a modification example of the arrangement or the like of the spaces of the ultrasonic sensor.

FIG. 6 is a plan view illustrating another modification example of the arrangement or the like of the spaces of the ultrasonic sensor.

DESCRIPTION OF EXEMPLARY EMBODIMENTS

Hereinafter, an embodiment of the invention will be described with reference to the drawings. The following description is provided to describe an aspect of the invention and it is possible to arbitrarily modify the aspect within the scope of the invention. In each drawing, the same reference symbol is assigned to the same member, and thus, description thereof is omitted.

Embodiment 1

Ultrasonic Device

Figure 1:
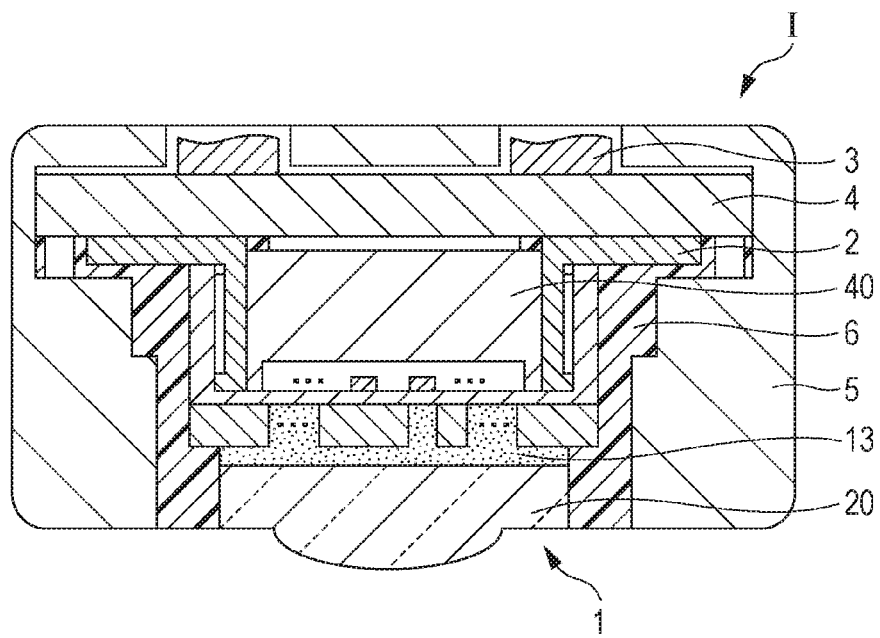
FIG. 1 is a sectional view illustrating a configurational example of an ultrasonic device.

FIG. 1 is a sectional view illustrating a configurational example of an ultrasonic device in which an ultrasonic sensor is mounted. As illustrated in FIG. 1, the ultrasonic probe I is configured to include an ultrasonic sensor 1, a flexible printed circuit board (FPC board 2) connected to the ultrasonic sensor 1, a cable 3 extending from an apparatus terminal (not illustrated), a relay substrate 4 that performs relay between the FPC board 2 and the cable 3, a housing 5 that protects the ultrasonic sensor 1, the FPC board 2, and the relay substrate 4, and a water-resistant resin 6 with which a gap between the housing 5 and the ultrasonic sensor 1 is filled.

An ultrasonic wave is transmitted from the ultrasonic sensor 1. In addition, an ultrasonic wave reflected from a measurement target object is received by the ultrasonic sensor 1. In an apparatus terminal of the ultrasonic probe I, information (a position, a shape, or the like) related to the measurement target object is detected, based on a waveform signal of the ultrasonic waves.

According to the ultrasonic sensor 1, as will be described below, it is possible to maintain good sonic characteristics while achieving a high-density arrangement of ultrasonic sensor elements. Therefore, when the ultrasonic sensor 1 is mounted in the ultrasonic device, the ultrasonic device has various good characteristics. The invention can be applied to any type of ultrasonic sensor such as a transmission-only type ultrasonic sensor optimized for transmission of an ultrasonic wave, a reception-only type ultrasonic sensor optimized for reception of an ultrasonic wave, and a transmission-reception integral type ultrasonic sensor optimized for transmission and reception of the ultrasonic wave. The ultrasonic device in which the ultrasonic sensor 1 can be mounted is not limited to the ultrasonic probe I.

Ultrasonic Sensor

Overall Configuration

Figure 3A:
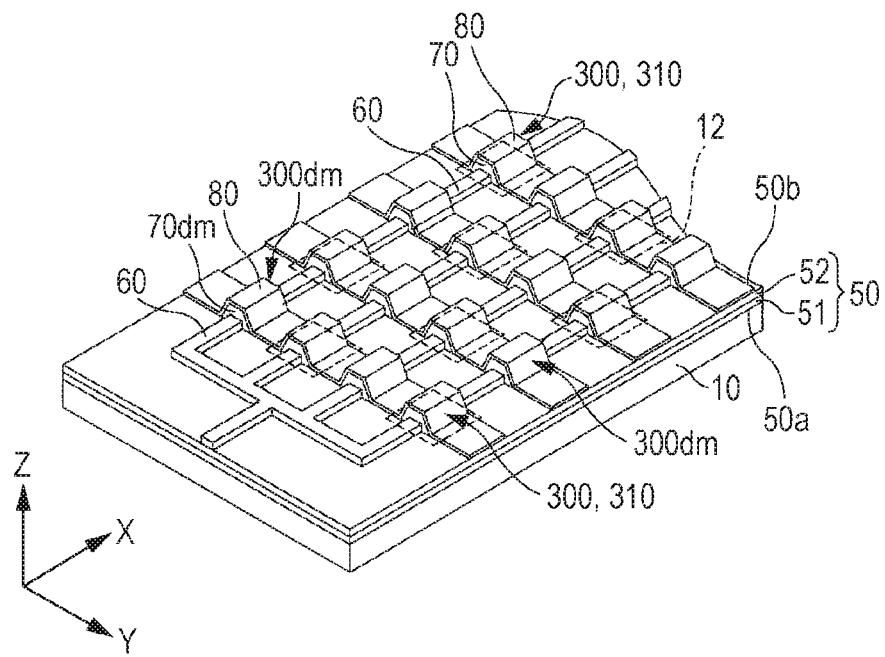
FIGS. 3A and 3B are perspective views illustrating the configurational example of the configuration of the ultrasonic sensor.
Figure 3B:
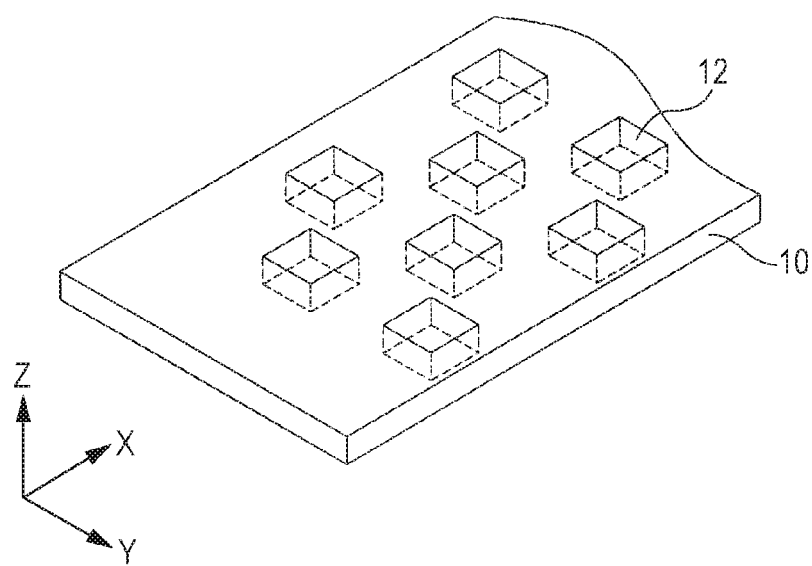

FIG. 2 is an exploded perspective view illustrating a configurational example of the ultrasonic sensor. FIGS. 3A and 3B are enlarged views illustrating the configurational example of the ultrasonic sensor in FIG. 2. FIG. 3A is an enlarged view illustrating the configurational example of the ultrasonic sensor element in FIG. 2, and FIG. 3B is an enlarged view illustrating the configurational example of a substrate in FIG. 2.

The ultrasonic sensor 1 is configured to have an ultrasonic sensor element 310, a sonic adjustment layer 13, a lens member 20, and a surrounding plate 40. The ultrasonic sensor element 310 is configured to have a space 12 formed in a substrate 10, a vibrating plate 50, and a piezoelectric element 300.

When two orthogonal axes are referred to as an X axis and a Y axis and a plane formed by the X axis and the Y axis is referred to as an XY plane, the substrate 10 is formed across the XY plane. Hereinafter, the X axis is referred to as the first direction X, the Y axis is referred to as the second direction Y, and a Z axis orthogonal to both the first direction X and the second direction Y is referred to as the third direction Z.

A plurality of diaphragms 11 are formed on the substrate 10. The plurality of diaphragms 11 demarcate a plurality of spaces 12 in the first direction X and the second direction Y. For the substrate 10, a monocrystal silicon substrate can be used. The substrate 10 is not limited to the example described above; however, an SOI substrate or a glass substrate may be used.

The spaces 12 are arranged to form a zigzag shape. In addition, the space 12 extends through the substrate 10 in the third direction Z. The space 12 has a square shape (where an aspect ratio of the lengths in the first direction X and the second direction Y is 1:1) when viewed in the third direction Z. The space 12 may have a rectangular shape (where an aspect ratio of the lengths in the first direction X and the second direction Y is not 1:1) when viewed in the third direction Z.

The vibrating plate 50 is provided on the substrate 10 so as to enclose the space 12. Hereinafter, a surface of the vibrating plate 50 on the substrate 10 side is referred to as a first surface 50a, and the surface facing the first surface 50a is referred to as a second surface 50b. The vibrating plate 50 is configured to have an elastic film 51 disposed on the substrate 10 and an insulation layer 52 disposed on the elastic film 51. In this case, the first surface 50a is formed of the elastic film 51, and the second surface 50b is formed of the insulation layer 52. The elastic film 51 is formed of silicon oxide ($SiO_2$) or the like, and the insulation layer 52 is formed of zirconium oxide ($ZrO_2$) or the like. The elastic film 51 may not be a member separate from the substrate 10. A part of the substrate 10 is subjected to thinning and may be used as an elastic film.

The piezoelectric element 300 is provided in a portion on the second surface 50b side of the vibrating plate 50 that corresponds to the space 12. The piezoelectric element 300 is configured to have a first electrode 60, a piezoelectric layer 70 on the first electrode 60, and a second electrode 80 on the piezoelectric layer 70. In the ultrasonic sensor 1, the first electrode 60 is set as an individual electrode used to drive each set of four columns extending in the first direction X, and the second electrode 80 is set as a common electrode that is common to each set of four columns extending in the second direction Y. In a case of a driving circuit and wiring, the first electrode may be set as the common electrode, and the second electrode may be set as an individual electrode.

Supply of an electric signal to the first electrode 60 and the second electrode 80 causes the piezoelectric layer 70 to be displaced. Conversely, the displacement of the piezoelectric layer 70 causes an electric signal to be obtained from the first electrode 60 and the second electrode 80. An ultrasonic wave is transmitted or received in the ultrasonic sensor 1, in response to the displacement of the piezoelectric element 300. A bending region of the piezoelectric element 300 is ensured by the space 12.

The piezoelectric element 300 is provided in the portion on the second surface 50b side of the vibrating plate 50, which corresponds to the space 12, and has a function of transmitting and receiving the ultrasonic wave. As described above, since the spaces 12 are arranged to form a zigzag shape, in the ultrasonic sensor 1, the piezoelectric elements 300 having the function of transmitting and receiving the ultrasonic wave are also arranged to form a zigzag shape.

Meanwhile, a dummy piezoelectric element 300dm is provided on the second direction Y side away from the piezoelectric element 300. The dummy piezoelectric element 300dm is configured to have a dummy piezoelectric layer 70dm interposed between the first electrode 60 and the second electrode 80. The dummy piezoelectric element 300dm is provided in the portion on the second surface 50b side of the vibrating plate 50, which corresponds to the diaphragm 11 and does not provide any actual function of transmitting or receiving of the ultrasonic wave. In other words, although the dummy piezoelectric element 300dm is disposed, the dummy piezoelectric element does not have a significant adverse affect on the transmission/reception efficiency of the ultrasonic wave.

The dummy piezoelectric element 300dm can prevent a current from being applied to the first electrode 60 and the second electrode 80 in the portion (portion on the second surface 50b side of the vibrating plate 50, which does not correspond to the space 12) on the second surface 50b side of the vibrating plate 50, which corresponds to the diaphragm 11.

In this manner, the ultrasonic sensor 1 has both the piezoelectric element 300 corresponding to the space 12 and the dummy piezoelectric element 300dm (not corresponding to the space 12) corresponding to diaphragm 11. More specifically, in the ultrasonic sensor 1, the piezoelectric element 300 and the dummy piezoelectric element 300dm are alternately provided in the first direction X and the second direction Y.

The ultrasonic sensor element 310 is configured to have the space 12 formed in the substrate 10, the vibrating plate 50, and the piezoelectric element 300. In the ultrasonic sensor element 310, the sonic adjustment layer 13, the lens member 20, and the surrounding plate 40 are provided, and the ultrasonic sensor element becomes the ultrasonic sensor 1.

The sonic adjustment layer 13 is provided in the space 12. The sonic adjustment layer 13 can prevent sonic impedance from rapidly changing between the piezoelectric element 300 and the measurement target object and, as a result, it is possible to prevent a reduction in the propagation efficiency of the ultrasonic wave. The sonic adjustment layer 13 can be formed of, for example, a silicone resin; however, the sonic adjustment layer is not limited to the example described above.

The lens member 20 is provided on a side of the substrate 10 opposite to the vibrating plate 50. Here, the sonic adjustment layer 13 described above has a function of ensuring adhesion of the lens member 20 and the substrate 10 to each other. The ultrasonic sensor 1 is configured to include the sonic adjustment layer 13, which is interposed between the lens member 20 and the substrate 10 (diaphragm 11).

The surrounding plate 40 is provided on the second surface 50b side of the vibrating plate 50. The surrounding plate 40 covers a region on the periphery of the piezoelectric element 300 (region including the top surface and side surfaces of the piezoelectric element 300). The region on the periphery of the piezoelectric element 300, which is covered by the surrounding plate 40, may be filled with air or may be filled with a resin.

The ultrasonic sensor 1 is configured as a type in which the side of the vibrating plate 50 opposite to the piezoelectric element 300 becomes an ultrasonic wave passing region (so-called CAV surface type). Accordingly, since a configuration in which water moisture is unlikely to reach the piezoelectric element 300 from the outside can be realized, the ultrasonic sensor 1 has good electrical safety during use. In a case where the piezoelectric element 300 is a thin film, it is possible to enhance handling in manufacturing and, thus, it is easy to handle the ultrasonic sensor 1.

Arrangement of Spaces or the Like

Figure 4A:
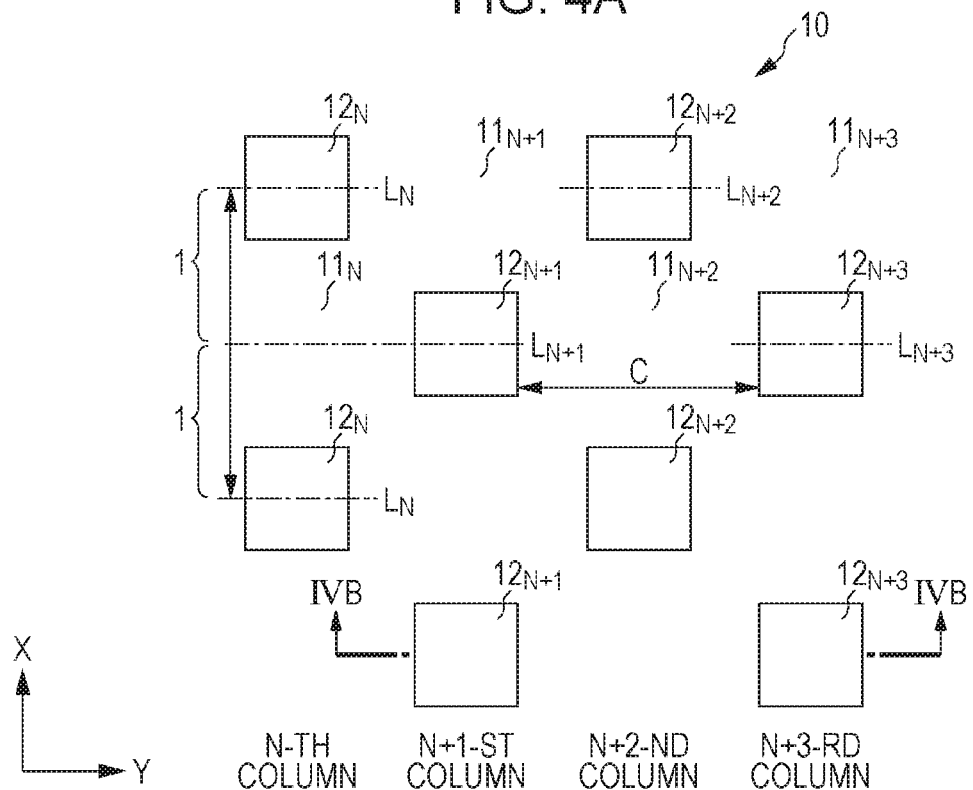
FIGS. 4A and 4B are a plan view and a sectional view illustrating arrangement or the like of spaces of an ultrasonic sensor element.
Figure 4B:
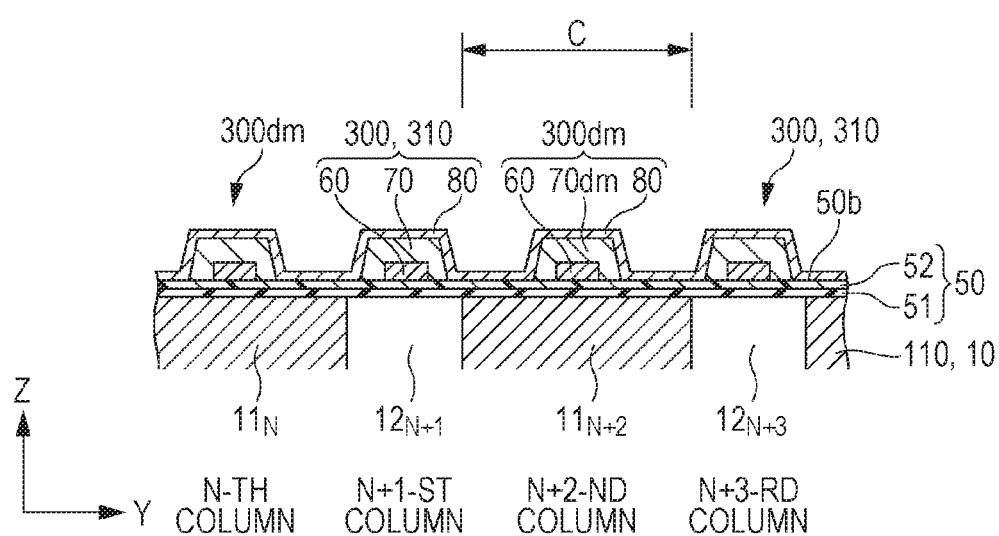

FIGS. 4A and 4B are a plan view and a sectional view illustrating arrangement and the like of the spaces of the ultrasonic sensor element. FIG. 4A is a plan view of the substrate of the ultrasonic sensor element, when viewed in the third direction Z. FIG. 4B is a sectional view taken along line IVB-IVB in FIG. 4A.

The spaces 12 are arranged to form a zigzag shape. That is, the spaces 12 juxtaposed in the first direction X and the second direction Y are formed at pitches shifted in a juxtaposed-arrangement direction between the spaces 12 in a direction intersecting the juxtaposed-arrangement direction described above. For example, in the ultrasonic sensor 1, the spaces 12 juxtaposed in the first direction X are formed at pitches shifted in the first direction X between the spaces 12 on one side in the second direction Y from the corresponding spaces 12.

For example, columns of the spaces 12 juxtaposed in the first direction X are referred to as the N-th column, N+1-st column, N+2-nd column, N+3-rd column, . . . (where N is a positive integer) in this order in the second direction Y. Spaces $12_N$ in the N-th column are juxtaposed in the first direction X through the diaphragm $11_N$. Similarly, spaces $12_{N+1}$ in the N+1-st column are juxtaposed in the first direction X through the diaphragm $11_{N+1}$, spaces $12_{N+2}$ in the N+2-nd column are juxtaposed in the first direction X through the diaphragm $11_{N+2}$, and spaces $12_{N+3}$ in the N+3-rd column are juxtaposed in the first direction X through the diaphragm $11_{N+3}$.

The spaces $12_N$ in the N-th column are arranged on one side in the second direction Y (leftward side in FIGS. 4A and 4B) from the spaces $12_N+$, in the N+1-st column. The spaces $12_{N+1}$ in the N+1-st column are arranged at pitches shifted in the first direction X, between the spaces $12_N$ in the N-th column. In addition, the spaces $12_{N+2}$ in the N+2-nd column are also arranged on the other side in the second direction Y (rightward side in FIGS. 4A and 4B) from the spaces $12_{N+1}$ in the N+1-st column. The spaces $12_{N+1}$ in the N+1-st column are also arranged at pitches shifted in the first direction X, also between the spaces $12_{N+2}$ in the N+2-nd column.

Similarly, the spaces $12_{N+3}$ in the N+3-rd column are arranged at pitches shifted in the first direction X, between the spaces $12_{N+2}$ in the N+2-nd column. The spaces $12_{N+3}$ in the N+3-rd column are arranged at pitches shifted in the first direction X, between the spaces in the N+4-th column (not illustrated).

In this case, for example, the diaphragm $11_{N+2}$ demarcating the spaces $12_{N+2}$ in the N+2-nd column is position between the spaces $12_N+$, in the N+1-st column and the spaces $12_{N+3}$ in the N+3-rd column. In this manner, a wall thickness C can be ensured between the spaces $12_{N+1}$ in the N+1-st column and the spaces $12_{N+3}$ in the N+3-rd column. Therefore, the entire substrate 10 can suppress the influence of the displacement of the individual piezoelectric elements 300, and it is possible to prevent structural crosstalk from occurring, despite the ultrasonic sensor elements 310 collectively having a high-density arrangement.

Here, a virtual line $L_N$ is drawn in the second direction Y with respect to the spaces $12_N$ in the N-th column so as to pass through the center of the spaces $12_N$. Similarly, a virtual line $L_{N+1}$ is drawn with respect to the spaces $12_{N+1}$ in the N+1-st column, a virtual line $L_{N+2}$ is drawn with respect to the spaces $12_{N+2}$ in the N+2-nd column, and a virtual line $L_{N+3}$ is drawn with respect to the spaces $12_{N+3}$ in the N+3-rd column. In this case, when the virtual line $L_{N+1}$ is shifted to at least one side of (does not form the same straight line with) the virtual line $L_N$ and the virtual line $L_{N+2}$, the zigzag shape described above is formed. In addition, when the virtual line $L_{N+3}$ is shifted to at least one side of (does not form the same straight line with) the virtual line $L_{N+2}$ and the virtual line $L_{N+4}$ (not illustrated), the zigzag shape described above is formed.

In a case where the spaces 12 juxtaposed in the first direction X are shifted in the first direction X at an interval of M rows in the second direction Y, the virtual line $L_N$ and the virtual line $L_N+M$ are positioned to form the same straight line (M is a positive integer). The spaces 12 juxtaposed in the first direction X may be shifted in the first direction X at an interval of two rows, three rows, four rows, or five or more rows in the second direction Y. In the ultrasonic sensor 1, the spaces 12 juxtaposed in the first direction X are shifted in the first direction X at an interval of two rows in the second direction Y. In other words, the virtual line $L_N$ and the virtual line $L_{N+2}$ form the same straight line and the virtual line $L_{N+1}$ and the virtual line $L_{N+4}$ (not illustrated) form the same straight line. When the shifting interval of the spaces 12 is small, the arrangement of the spaces 12 is simplified to the extent thereof, which eventually simplifies the configuration of the substrate 10.

Here, it is preferable that the virtual line $L_{N+1}$ pass through the diaphragm $11_N$ demarcating the spaces $12_N$ in the N-th column or the diaphragm $11_{N+2}$ demarcating the spaces $12_{N+2}$ in the N+2-nd column. In the ultrasonic sensor 1, the spaces $12_N+$, in the N+1-st column are formed at half pitches in the first direction X with respect to spaces $12_N$ in the N-th column and spaces $12_{N+2}$ in the N+2-nd column. In other words, the virtual line $L_{N+1}$ is positioned so as to divide the diaphragm $11_N$ or the diaphragm $11_{N+2}$ into two sections having a ratio of 1:1 in the first direction. In this manner, the wall thickness C can be appropriately ensured between the spaces $12_N+$, in the N+1-st column and the spaces $12_{N+3}$ in the N+3-rd column.

In the ultrasonic sensor 1, as described above, the virtual line $L_N$ and the virtual line $L_{N+2}$ are positioned on the same straight line. Therefore, a configuration in which the virtual line $L_{N+1}$ passes through the diaphragm $11_N$ and the diaphragm $11_{N+2}$ can be realized. Hence, it is possible to reliably prevent the occurrence of structural crosstalk.

However, the extent to which the spaces 12 is shifted in the first direction X is not limited thereto. When predetermined spaces 12 are shifted in the first direction X, the wall thickness C of the spaces 12 can be ensured depending on the shift amount. The arrangement of the spaces 12 can be variously modified.

FIGS. 5A to 7 are plan views illustrating a modification example of the arrangement or the like of the spaces of the ultrasonic sensor. In substrate 10A illustrated in FIG. 5A, the degree of the pitch at which the spaces $12_N$ in the N+1-st column are shifted in the first direction X is small. In other words, it is known that the virtual line $L_{N+1}$ passes through the spaces $12_N$ in the N-th column or the spaces $12_{N+2}$ in the N+2-nd column; however, even in this case, the wall thickness C can be ensured in the portion in which the spaces 12 are arranged to form the zigzag shape.

In substrate 10B illustrated in FIG. 5B, the spaces 12 which are juxtaposed in the first direction X are shifted in the first direction X at the interval of three rows in the second direction Y. The spaces $12_{N+1}$ in the N+1-st column are arranged to be shifted at about ⅓ pitches in the first direction X with respect to the spaces $12_N$ in the N-th column. Also, the spaces $12_{N+2}$ in the N+2-nd column are arranged to be shifted at about ⅔ pitches in the first direction X with respect to the spaces $12_N$ in the N-th column. In this case, the wall thickness C can be ensured in the portion in which the spaces 12 are arranged to form the zigzag shape.

In substrate 10C illustrated in FIG. 6, some of the spaces $12_{N+1}$ in the N+1-st column are formed to be shifted in the first direction X with respect to the spaces $12_N$ in the N-th column, the spaces $12_{N+2}$ in the N+2-nd column, and the spaces $12_{N+3}$ in the N+3-rd column. In this case, it is also possible to ensure the wall thickness C in the portion in which the spaces 12 are arranged to form the zigzag shape.

Figure 7:
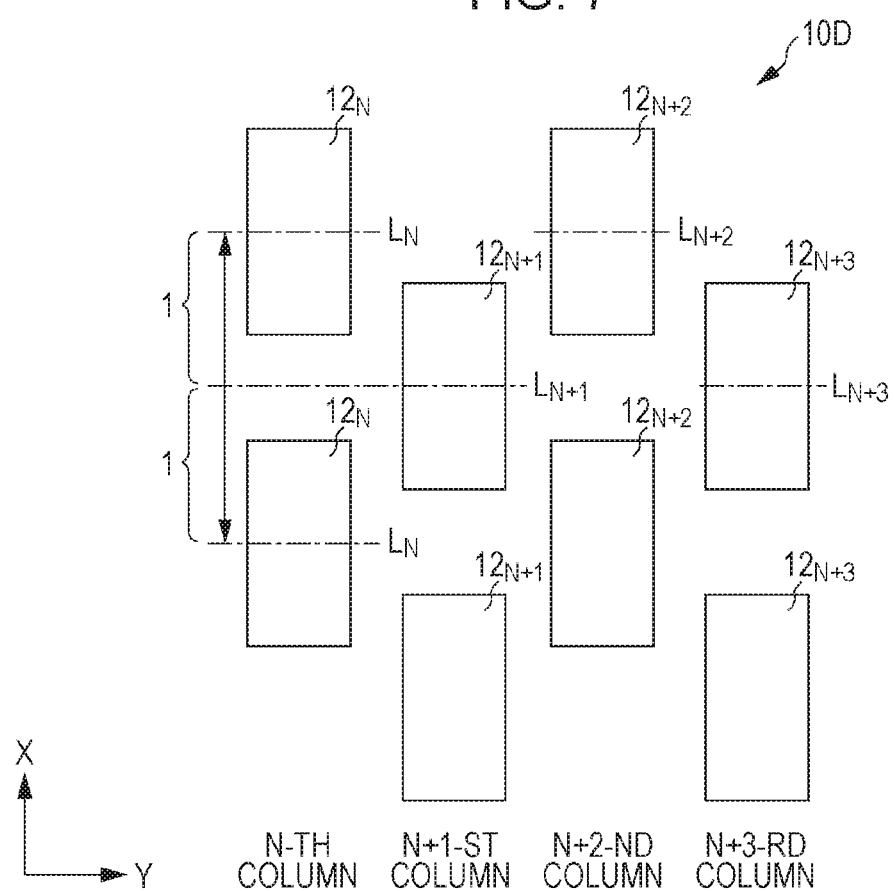
FIG. 7 is a plan view illustrating still another modification example of the arrangement or the like of the spaces of the ultrasonic sensor.

In substrate 10D illustrated in FIG. 7, the space 12 has a rectangular shape (where an aspect ratio of the lengths in the first direction X and the second direction Y is not 1:1) when viewed in the third direction Z. In this case, it is also possible to ensure the wall thickness C in the portion in which the spaces 12 are arranged to form the zigzag shape.

It is possible to combine the configuration in FIGS. 4A and 4B described above and the configurations in FIGS. 5A to 7 described above with one another. It is also possible to combine the configurations in FIGS. 5A to 7 described above with one another. The invention is not limited to the configurational examples described above. The spaces juxtaposed in the second direction Y may be formed at pitches shifted in the second direction Y between the spaces on one side in the first direction from the corresponding spaces. In the range of the invention, at least some of the spaces 12 may be arranged to form the zigzag shape in the first direction X or the second direction Y.

Piezoelectric Element or the Like

The piezoelectric element 300 is configured to have the first electrode 60 with a thickness of about 0.2 µm, the piezoelectric layer 70 with a thickness equal to or less than about 3.0 µm, and preferably about 0.5 m to 1.5 m, and the second electrode 80 with a thickness of about 0.05 µm. In the ultrasonic sensor 1, the spaces 12 described above are arranged to form a zigzag shape; in comparison, the piezoelectric elements 300 and dummy piezoelectric elements 300dm are alternately provided in the first direction X and the second direction Y. The configuration of the dummy piezoelectric layer 70dm is the same as that of the piezoelectric layer 70. The configuration of the dummy piezoelectric layer 70dm may be different from that of the piezoelectric layer 70.

The ultrasonic wave is transmitted and received in response to the displacement of the piezoelectric element 300 provided in the region on the second surface 50b side of the vibrating plate 50, which corresponds to the space 12. When the first direction X is a scanning direction and the second direction Y is a slicing direction, the ultrasonic sensor 1 performs scanning in the scanning direction and performs transmission and reception of the ultrasonic wave for every row extending in the slicing direction. In this manner, sensing information in the slicing direction can be continuously acquired in the scanning direction.

In the present embodiment, the displacement of the piezoelectric layer 70 causes at least the vibrating plate 50 and the first electrode 60 to be displaced. In other words, in the present embodiment, at least the vibrating plate 50 and the first electrode 60 have a function as actual vibrating plates. Here, one or both of the elastic film 51 and the insulation layer 52 are not provided and only the first electrode 60 may be function as the vibrating plate. In a case where the first electrode 60 is directly provided on the substrate 10, it is preferable that the first electrode 60 is protected with a protective film or the like having insulating properties.

Although not illustrated in the drawings, another layer may be provided between the piezoelectric element 300 and the vibrating plate 50. For example, an adhesion layer for improving adhesiveness may be provided between the piezoelectric element 300 and the vibrating plate 50. Such an adhesion layer may be formed of, for example, a titanium oxide (TiOx) layer, a titanium (Ti) layer, or a silicon nitride (SiN) layer.

The piezoelectric element 300 is positioned in a region on the inner side of the space 12 when viewed in the third direction Z. In other words, the piezoelectric element 300 is shorter than the space 12 both in the first direction X and the second direction Y. Here, either the case where the piezoelectric element 300 is longer than the space 12 in the first direction X or the case where the piezoelectric element 300 is longer than the space 12 in the second direction Y is included in the invention.

There is no limitation to the material of the first electrode 60 and the second electrode 80, as long as the material has conductivity. Examples of the first electrode 60 and the second electrode 80 include a metallic material, a tin oxide-based conductive material, a zinc oxide-based conductive material, and an oxide conductive material. Examples of the metallic material include platinum (Pt), iridium (Ir), gold (Au), aluminum (Al), copper (Cu), titanium (Ti), stainless steel, or the like. Examples of the tin oxide-based conductive material include indium tin oxide (ITO), fluorine doped tin oxide (FTO), or the like. Examples of the oxide conductive material include zinc oxide-based conductive material, strontium ruthenium oxide ($SrRuO_3$), lanthanum nickel oxide ($LaNiO_3$), element doped strontium titanate, or the like. The material of the first electrode 60 and the second electrode 80 may be a conductive polymer.

The piezoelectric layer 70 is configured to be subjected to patterning for each space 12 and is interposed between the first electrode 60 and the second electrode 80. The piezoelectric layer 70 is formed to contain a complex oxide having, for example, an $ABO_3$ type perovskite structure. When a non-lead-based material having a reduced content of lead is used as the complex oxide, it is possible to reduce an environment load. An example of the non-lead-based material includes for example, a KNN-based complex oxide or the like containing potassium (K), sodium (Na), and niobium (Nb).

In the $ABO_3$ perovskite type structure A site of an $ABO_3$ type structure is twelve fold coordinated by oxygen, and B site thereof is octahedrally six fold coordinated by oxygen. In the example using the KNN-based complex oxide, N and Na are positioned at the A site, Nb is positioned at the B site, and a composition formula thereof is expressed, for example, $(K,Na)NbO_3$.

Other elements may be contained in the KNN-based complex oxide. Examples of the other elements include lithium (Li), bismuth (Bi), barium (Ba), calcium (Ca), strontium (Sr), samarium (Sm), and cerium (Ce) which are replaced for a part of the A site of the piezoelectric layer 70, and manganese (Mn), zinc (Zn), zirconium (Zr), magnesium (Mg), Copper (Cu), aluminum (Al), nickel (Ni), cobalt (Co), chromium (Cr), and titanium (Ti) which are replaced for a part of the B site of the piezoelectric layer 70, and the like.

It is preferable that the KNN-based complex oxide does not contain lead; however, lead (Pb), which is replaced for a part of the A site, may be contained as another element. Examples of the other element are not limited thereto but include tantalum (Ta), antimony (Sb), silver (Ag), and the like. Two or more elements selected from the other elements may be contained. In general, an amount of the other elements is equal to or less than 15% of a total amount of the elements as main components, and preferably equal to or less than 10% thereof. The use of the other elements enables various characteristics to be enhanced and a configuration, a function, or the like to be achieved in various ways, in some cases. In the case where the complex oxide uses the other elements, it is also preferable that the complex oxide has the $ABO_3$ perovskite structure.

Examples of the non-lead-based material include, in addition to the KNN-based complex oxide described above, a BFO-based complex oxide including bismuth (Bi) and iron (Fe) or a BF-BT complex oxide including bismuth (Bi), barium (Ba), iron (Fe), and titanium (Ti). In the examples of the BFO-based complex oxide, Bi is positioned at the A site, Fe and Ti are positioned at the B site, and a composition formula thereof is expressed by $BiFeO_3$. In the examples of the BF-BT-based complex oxide, Bi and Ba are positioned at the A site, Fe and Ti are positioned at the B site, and a composition formula thereof is expressed by $(Bi,Ba)(Fe,Ti)O_3$.

The other elements may be contained in the BFO-based complex oxide or in the BF-BT-based complex oxide. Examples of the other elements are as described above. In addition, the elements forming the KNN-based complex oxide may be contained in the BFO-based complex oxide or in the BF-BT-based complex oxide.

The piezoelectric layer 70 may be formed of a complex oxide as a main component other than the non-lead-based material. An example of the complex oxide other than the non-lead-based material includes lead zirconate titanate (Pb(Zr,Ti)O$_3$; PZT) based complex oxide. In this manner, it is easy to achieve displacement enhancement of the piezoelectric element 300. It is needless to say that the other elements may be contained in the PZT-based complex oxide. The examples of the other elements are as above.

Examples of the complex oxide having the ABO$_3$ type perovskite structure include a complex oxide obtained due to variations by deficit/excess in stoichiometric composition and a complex oxide obtained when some of the elements are replaced with the other elements. In other words, as long as the perovskite structure is obtained, not only unavoidable variations of composition due to lattice mismatch and oxygen deficiency, but also partial replacement of the elements or the like is allowed.

Manufacturing Method

Next, an example of a manufacturing method for the ultrasonic sensor 1 will be described. FIGS. 8A to 10C illustrate respective processes of the manufacturing method for the ultrasonic sensor. The respective drawings show plan views shown in the third direction Z, sectional views taken along lines VIIIB-VIIIB, IXB-IXB, and XB-XB, and sectional views taken along lines VIIIC-VIIIC, IXC-IXC, and XC-XC. The lines VIIIB-VIIIB, IXB-IXB, and XB-XB are along the first direction X and the lines VIIIC-VIIIC, IXC-IXC, and XC-XC are along the second direction Y.

First, an elastic film 51 formed of the silicon oxide is formed through thermal oxidation on the surface of a silicon wafer 110 (10) for the substrate. Then, zirconium is deposited on the elastic film 51 and the insulation layer 52 formed of zirconium oxide is formed through the thermal oxidation.

Figure 8A:
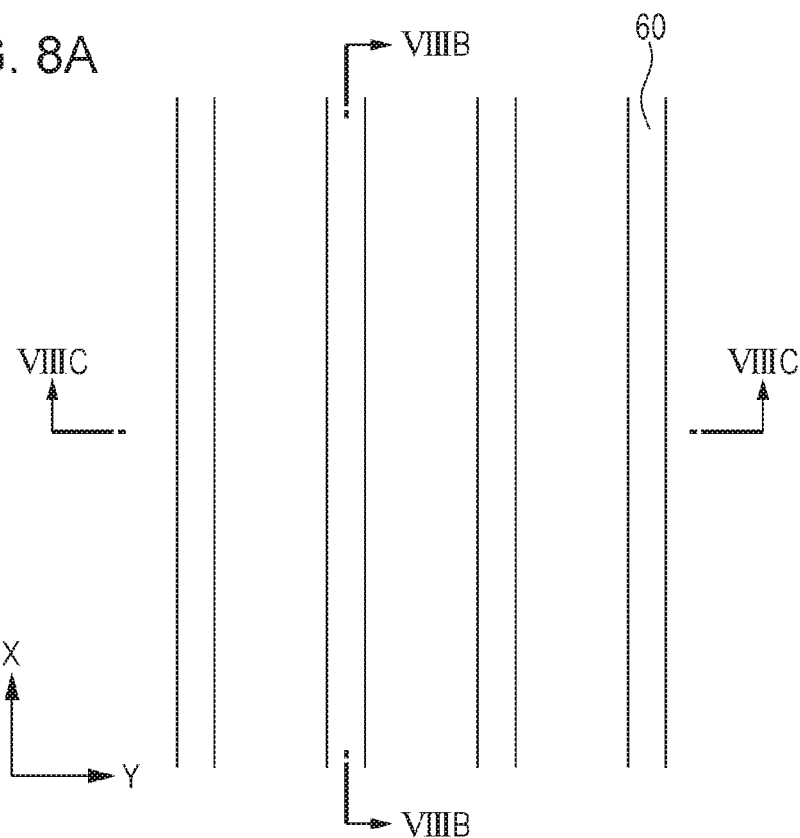
FIGS. 8A to 8C are views illustrating an example of a manufacturing method for the ultrasonic sensor.
Figure 8B:
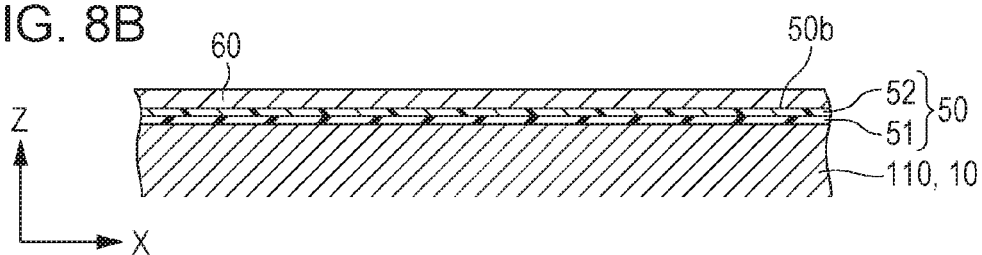
Figure 8C:
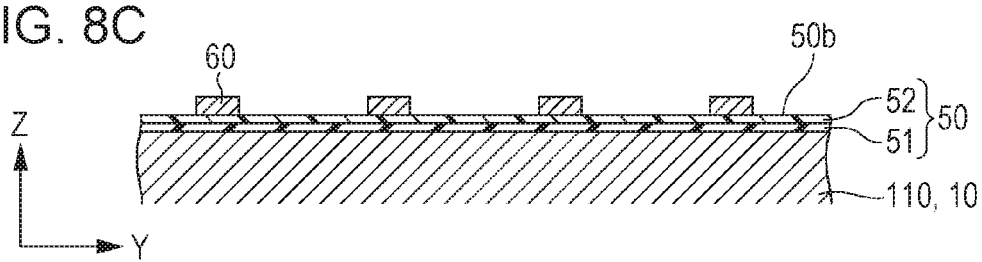
Figure 9A:
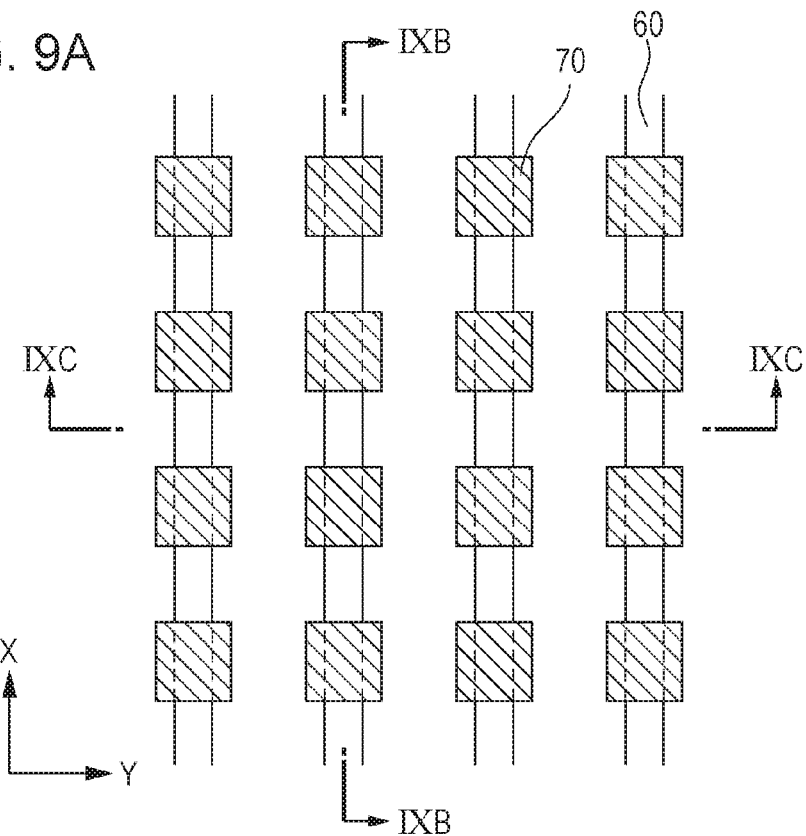
FIGS. 9A to 9C are views illustrating an example of a manufacturing method for the ultrasonic sensor.
Figure 9B:
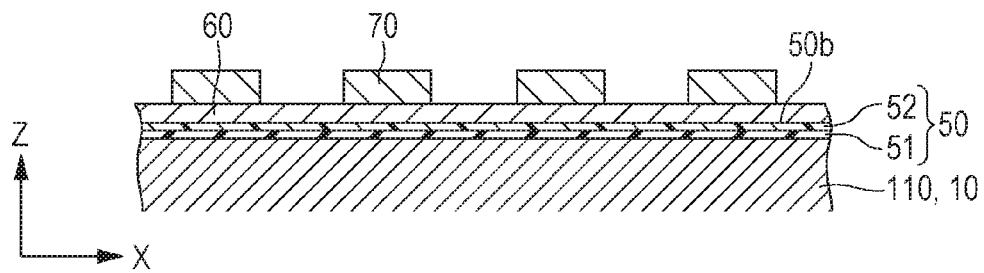
Figure 9C:
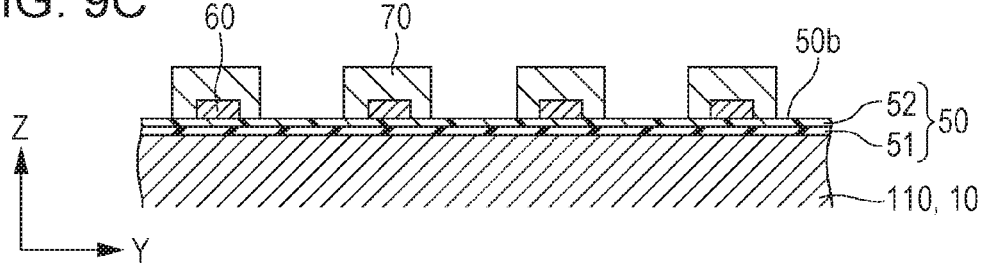

Also, as illustrated in FIGS. 8A to 8C, the first electrode 60 is formed on the insulation layer 52 using a sputtering method or a vapor deposition, and patterning is performed such that the first electrode 60 is formed to have a predetermined shape. Subsequently, as illustrated in FIGS. 9A to 9C, the piezoelectric layer 70 is stacked on the first electrode 60 and the vibrating plate 50. The piezoelectric layer 70 can be formed using a chemical solution deposition (CSD) through which a piezoelectric material formed of a metal oxide is obtained by applying and drying of a solution, in which a metal complex is dissolved and dispersed in a solvent, and then by baking the dried resultant at high temperature. The method is not limited to the CSD method, but a sol-gel method, a laser ablation method, a sputtering method, a pulse laser deposition method (PLD method), a CVD method, an aerosol deposition method, or the like may be used.

Next, the piezoelectric layer 70 is subjected to patterning for each piezoelectric element 300. Subsequently, the second electrode 80 is formed on the surfaces of the piezoelectric layer 70, the first electrode 60, and the vibrating plate 50 (second surface 50b of the vibrating plate 50) using the sputtering method and thermal oxidation. Also, the second electrode 80 is subjected to patterning so as to be divided for each row in the second direction Y and to be continuous for each column in the first direction X. In this manner, the piezoelectric element 300 including the first electrode 60, the piezoelectric layer 70, and the second electrode 80, is formed on the second surface 50b of the vibrating plate 50.

Figure 10A:
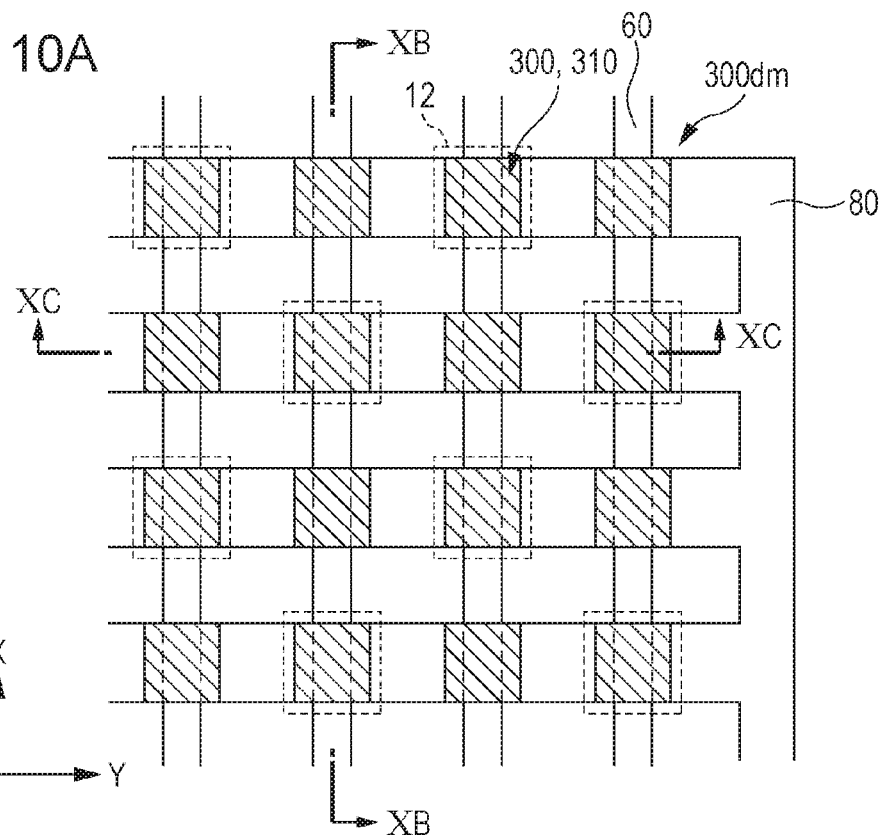
FIGS. 10A to 10C are views illustrating another example of the manufacturing method for the ultrasonic sensor.
Figure 10B:
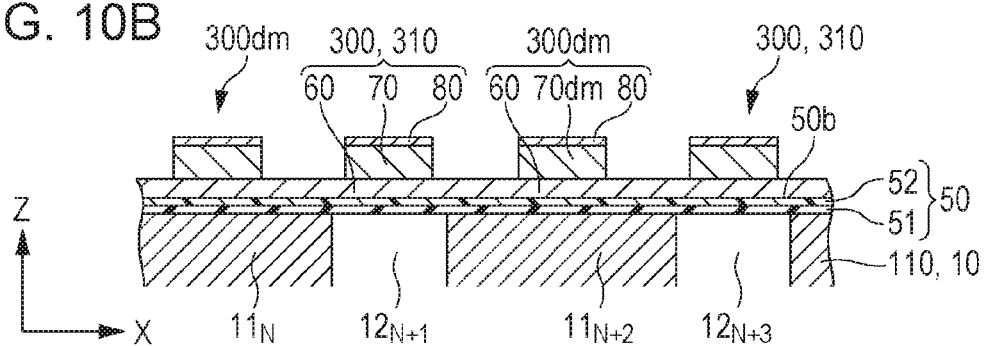
Figure 10C:
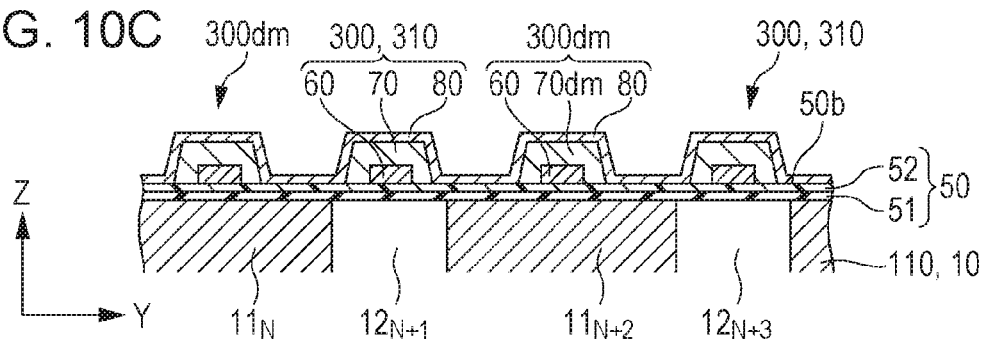

Further, a resist (not illustrated) is provided on the surface of the silicon wafer 110 (10) for the substrate on a side opposite to the piezoelectric element 300, the resist is subjected to patterning to have a predetermined shape, and a mask film (not illustrated) is formed. Also, as illustrated in FIGS. 10A to 10C, the silicon wafer 110 (10) for the substrate is dry-etched through the mask film. In this manner, a space 12 is formed in a region of the substrate 10 facing the piezoelectric element 300. The dry-etching needs a processing time, compared to a wet-etching, and it is possible to perform the process with high accuracy regardless of a crystal plane orientation of the silicon substrate. Due to an aspect ratio (ratio of lengths in the first direction X and the second direction Y), a shape, or the like, of the space 12, it is difficult to perform anisotropic etching (wet-etching) using an alkaline solution such as KOH, in some cases. In this case, it is also possible to appropriately form the space 12 or the like through the dry-etching. It is needless to say that it is possible to perform the wet-etching described above according to the aspect ratio (ratio of lengths in the first direction X and the second direction Y), a shape, or the like, of the space 12.

In the process of forming the mask film, the mask film is also provided on a part of the surface of the silicon wafer 110 (10) for the substrate, which faces the dummy piezoelectric element 300dm. In this manner, the diaphragm 11 remains to have a zigzag shape and the spaces 12 are arranged to form the zigzag shape.

Then, the respective members are provided in order and the ultrasonic sensor 1 illustrated in FIG. 2 or the like is prepared. In other words, the surrounding plate 40 adheres to the ultrasonic sensor element 310 side using an adhesive. Also, the sonic adjustment layer 13 is provided in the space 12 and the lens member 20 adheres through the sonic adjustment layer 13. The sonic adjustment layer 13 and the lens member 20 are provided, and then the surrounding plate 40 may adhere to the ultrasonic sensor element 310 side.

EXAMPLES

Hereinafter, the invention will be further specifically described with Examples. However, the invention is not limited to the following Examples.

Example 1

The ultrasonic sensor 1 was prepared in accordance with the embodiment described above. The wall thickness C (CAV wall thickness) between the spaces $12_N$ in the N-th column and the spaces $12_{N+2}$ in the N+2-nd column is 57 µm. Four columns of the first electrodes 60 extend in the first direction X and four rows of second electrodes 80 extend in the second direction Y. In each column, 29 ultrasonic sensor elements 310 are provided, that is, 116 ultrasonic sensor elements are provided in total.

Comparative Example 1 to Comparative Example 2

Figure 11A:
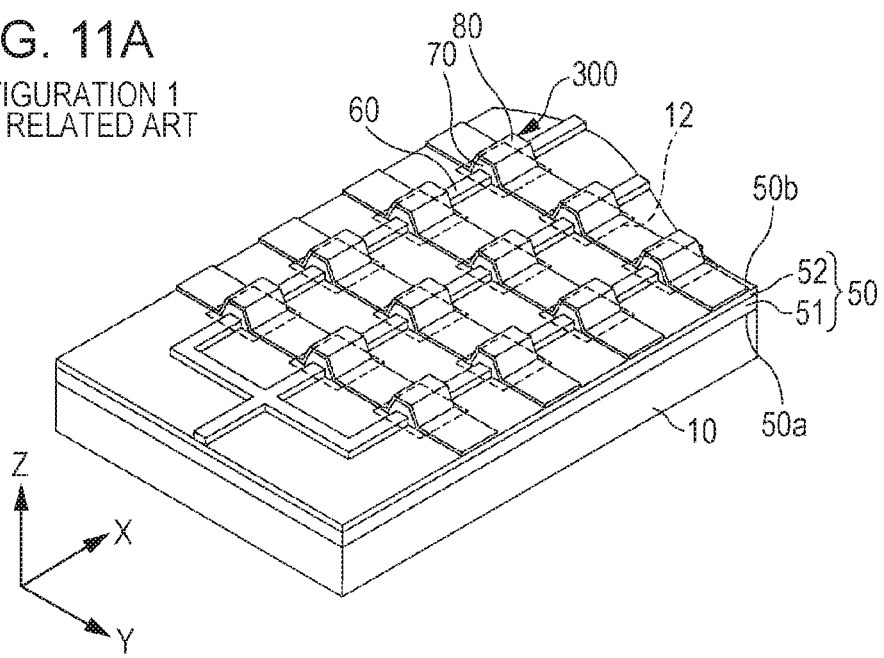
FIGS. 11A and 11B are perspective views illustrating a configurational example of a comparative example.
Figure 11B:
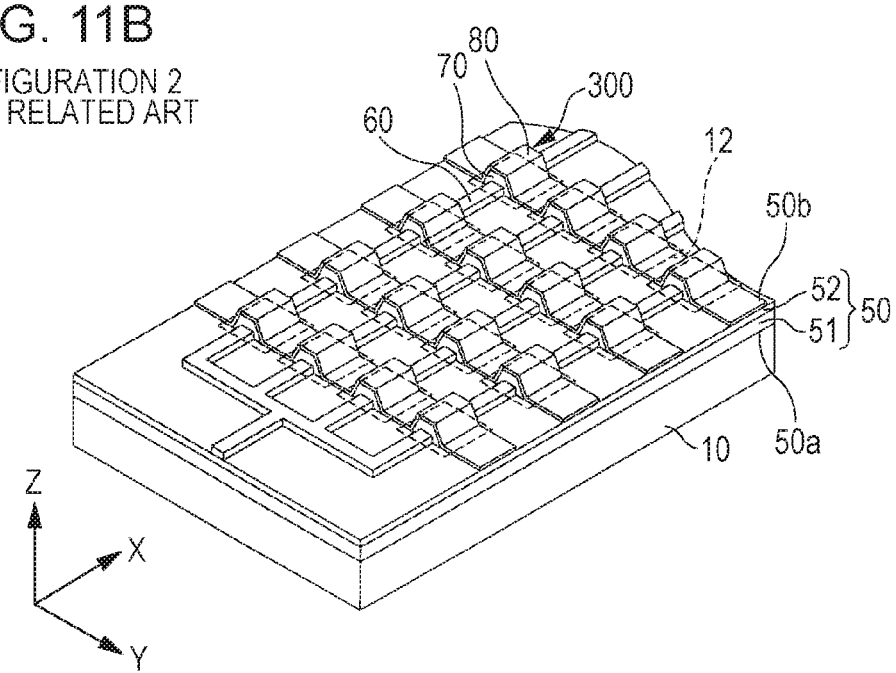

As illustrated in FIGS. 11A and 11B, the ultrasonic sensor is prepared in which the spaces 12 are not arranged to form the zigzag shape (the spaces 12 are arranged to form a lattice shape).

In the ultrasonic sensor of Comparative Example 1, the wall thickness C between the spaces $12_N$ in the N-th column and the spaces $12_{N+2}$ in the N+2-nd column is 25.5 µm. Three columns of the first electrodes 60 extend in the first direction X and three rows of second electrodes 80 extend in the second direction Y. In each column, 44 ultrasonic sensor elements 310 are provided, that is, 132 ultrasonic sensor elements 310 are provided in total (configuration 1 in the related art).

In the ultrasonic sensor of Comparative Example 2, the wall thickness C between the spaces $12_N$ in the N-th column and the spaces $12_{N+2}$ in the N+2-nd column is 9 µm. Four columns of the first electrodes 60 extend in the first direction X and four rows of second electrodes 80 extend in the second direction Y. In each column, 59 ultrasonic sensor elements 310 are provided, that is, 236 ultrasonic sensor elements 310 are provided in total (configuration 2 in the related art).

Displacement Measurement

Displacement is measured in the ultrasonic sensors of Example 1 and Comparative Examples 1 and 2. The optical heterodyne micro-vibration measuring device (Model: MLD-230D) by NEOARK Corporation is used for the measurement of the displacement. The results thereof are shown in Table and FIG. 12.

TABLE

| | Wall thickness C (µm) | The number of elements/column (elements) | The number of columns (columns) | The number of elements/ch (elements) | Amount of displacement (nm) | Amount of displacement (relative value) |
|---|---|---|---|---|---|---|
| Example 1 (zigzag arrangement) | 57 | 29 | 4 | 116 (29 × 4) | 450 | 1.13 |
| Comparative Examples 1 (configuration 1 in the related art) | 25.5 | 44 | 3 | 132 (44 × 3) | 400 | 1.0 |
| Comparative Examples 2 (configuration 2 in the related art) | 9 | 59 | 4 | 236 (59 × 4) | 200 | 0.5 |

Figure 12:
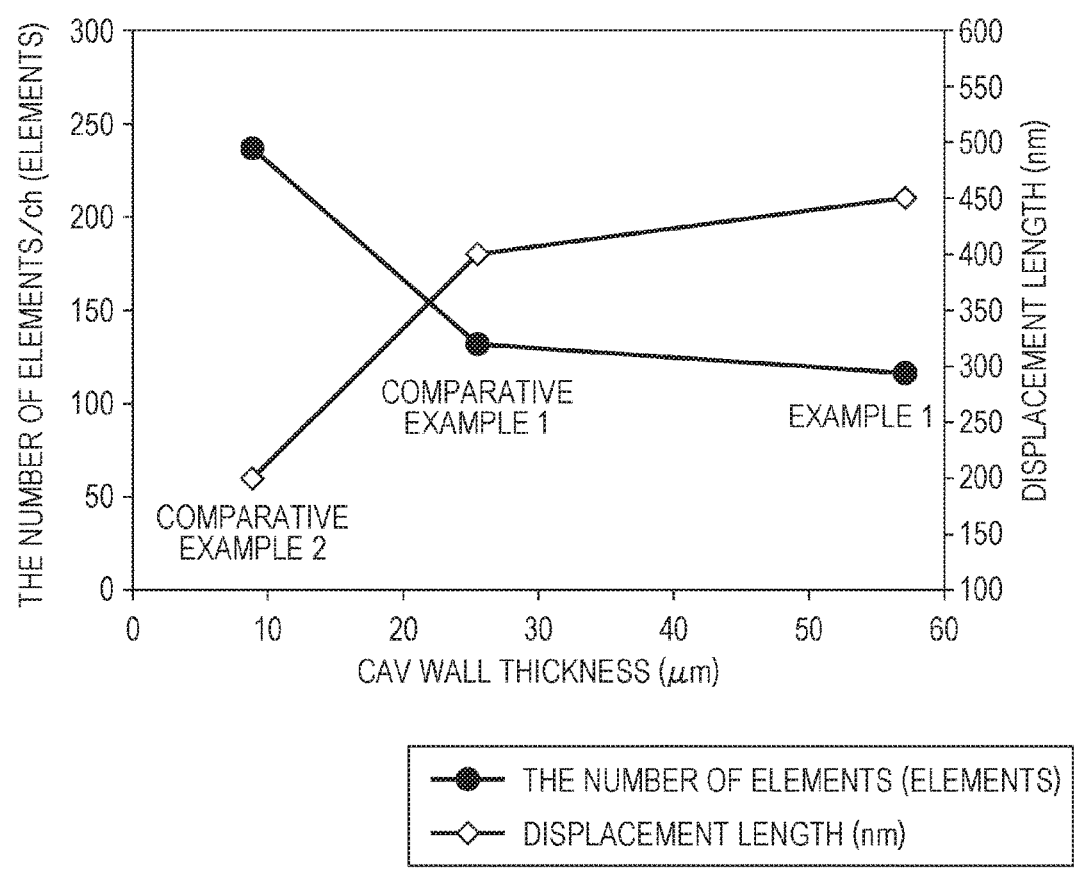
FIG. 12 is a view illustrating a result of an example in an experiment.

In the results in Table and FIG. 12, in Example 1, although, as the spaces 12 are arranged to form the zigzag shape, the number of ultrasonic sensor elements 310 is reduced, compared to Comparative Examples 1 and 2, it is verified that it is possible to achieve enhancement of the displacement characteristics to the extent that the enhancement exceeds the amount of reduction. Specifically, in the ultrasonic sensor of Comparative Example 1, twice the displace amount was obtained, compared to the ultrasonic sensor of Comparative Example 2; however, in the ultrasonic sensor in Example 1, about 1.13 times the displace amount was obtained, compared to the ultrasonic sensor of Comparative Example 1. This is because it is possible to prevent the structural crosstalk in Example 1.

Another Embodiment

As above, embodiments of the invention are described. However, a basic configuration of the invention is not limited to the embodiments described above. For example, the first electrode as the individual electrode may be an electrode of which driving can be performed for each column in the X-axis direction.

In addition, the plurality of spaces 12 may be formed in the substrate to have a one-dimensional shape, that is, in the first direction X or in the second direction Y. In this case, the spaces 12 may be formed between the spaces 12 adjacent in the juxtaposed-arrangement direction thereof so as to be shifted in a direction intersecting the juxtaposed-arrangement direction described above (to form the same straight line shape). When the virtual line $L_{N+1}$ is drawn in the juxtaposed-arrangement direction of the spaces 12 so as to pass through the centers of the spaces $12_{N+1}$, the virtual line $L_{N+1}$ is different from at least one of the virtual line $L_N$ and the virtual line $L_{N+2}$, and then the zigzag shape described above is formed.

The invention can be applied to any type of ultrasonic sensor such as a transmission-only type ultrasonic sensor, a reception-only type ultrasonic sensor, and a transmission-reception integral type ultrasonic sensor. In addition, the ultrasonic sensor of the invention can be applied to various ultrasonic devices. Particularly, the CAV surface type ultrasonic sensor has good electrical safety during use, compared to the ACT surface type ultrasonic sensor. Therefore, since the CAV surface type ultrasonic sensor is stable or the like, the CAV surface type ultrasonic sensor can be appropriately used in a medical apparatus in which a leakage current is a major concern, for example, an ultrasonic diagnostic apparatus, a sphygmomanometer, and a tonometer.

The ultrasonic sensor of the invention can be used as various pressure sensors. For example, the ultrasonic sensor can be applied as a sensor that detects pressure of ink in a liquid ejecting apparatus such as a printer. In addition, the configuration of the ultrasonic sensor of the invention can be preferably applied to an ultrasonic motor, a piezoelectric transformer, a vibration type dust removing device, a pressure electric conversion machine, an ultrasonic transmitter, and an acceleration sensor, or the like. A complete body obtained by using the configurations of the types of ultrasonic sensors, for example, a robot in which the ultrasonic sensor described above is mounted, or the like, is included in the ultrasonic device.

The components illustrated in the drawings, that is, a shape and size of the respective members, a thickness of the layer, a relative positional relationship, a repeated unit, or the like is magnified in the description of the invention, in some cases. In addition, in the specification, the term, "on", is not limited to the term, "immediately on", in a positional relationship between the components. For example, the description, "the piezoelectric element on the vibrating plate" does not exclude a state in which another component is included between the vibrating plate and the piezoelectric element.

The entire disclosure of Japanese Patent Application No. 2015-063324, filed Mar. 25, 2015 is expressly incorporated by reference herein.

What is claimed is:

1. An ultrasonic sensor comprising:
   a substrate disposed on an XY plane, the XY plane being a plane formed by an X axis and a Y axis, the X axis and the Y axis being two orthogonal axes;

a plurality of spaces formed in the substrate in at least one of an X-axis direction along the X axis and a Y-axis direction along the Y axis;
a vibrating plate that is provided on the substrate and that has a first surface and a second surface opposite to each other, the first surface being directly on the substrate, the vibrating plate spanning entirely across at least two of the plurality of spaces so that the two of the plurality of spaces are closed by the vibrating plate;
a plurality of piezoelectric elements that are provided at first discrete positions on the second surface of the vibrating plate, the first discrete positions corresponding to the plurality of spaces, each of the plurality of piezoelectric elements being configured to transmit/receive an ultrasonic wave; and
a plurality of dummy piezoelectric elements that are provided at second discrete positions on the second surface of the vibrating plate,
wherein at least some of the plurality of spaces are arranged in a zigzag pattern relative to one another,
wherein the substrate has a plurality of partitions, and the plurality of spaces and the plurality of partitions are alternatively arranged in at least one of the X-axis direction and the Y-axis direction,
the second discrete positions correspond to the plurality of partitions, and
one of the plurality of dummy piezoelectric elements is sandwiched by two adjacent elements of the plurality of piezoelectric elements in at least one of the X-axis direction and the Y-axis direction.

2. The ultrasonic sensor according to claim 1,
wherein each of the plurality of piezoelectric elements is configured with a first electrode, a piezoelectric layer on the first electrode, and a second electrode on the piezoelectric layer, and the plurality of piezoelectric elements are arranged in at least one of the X-axis direction and the Y-axis direction,
wherein the first electrode is an individual electrode, the first electrode is configured to deform some of a plurality of piezoelectric layers that are arranged in one of each column and each set of a plurality of columns in the X-axis direction,
wherein the second electrode is a common electrode which is common to each row extending in the Y-axis direction so that the second electrode is configured to deform some of the plurality of piezoelectric layers that are arranged in the Y-axis direction, and
wherein at least some of the plurality of spaces are formed at pitches shifted in the X-axis direction.

3. The ultrasonic sensor according to claim 2,
wherein each of the plurality of dummy piezoelectric elements is configured with the first electrode, a dummy piezoelectric layer on the first electrode, and the second electrode on the dummy piezoelectric layer.

4. The ultrasonic sensor according to claim 1,
wherein the plurality of spaces formed in the substrate in a plurality of the X-axis directions along the X axis and a plurality of the Y-axis directions along the Y axis, and each of the plurality of spaces has the same size in the plan view,
a first space is located on a first X-axis direction of the plurality of the X-axis directions, a second space is located on a second X-axis direction of the plurality of the X-axis directions, the first and second X-axis directions are directly adjacent to each other, and
a distance in the X-axis direction between a first line in the Y-axis direction passing a center of the first space and a second line in the Y-axis direction passing a center of the second space is shorter than a length in the X-axis direction of each of the first and second spaces.

5. A manufacturing method for an ultrasonic sensor, the ultrasonic sensor including:
a substrate disposed on an XY plane, the XY plane being a plane formed by an X axis and a Y axis, the X axis and the Y axis being two orthogonal axes;
a plurality of spaces formed in the substrate in at least one of an X-axis direction along the X axis and a Y-axis direction along the Y axis;
a vibrating plate that is provided on the substrate and that has a first surface and a second surface opposite to each other, the first surface being directly on the substrate, the vibrating plate spanning entirely across at least two of the plurality of spaces so that the two of the plurality of spaces are closed by the vibrating plate;
a plurality of piezoelectric elements that are provided at discrete positions on the second surface of the vibrating plate, the discrete positions corresponding to the plurality of spaces, each of the plurality of piezoelectric elements being configured to transmit/receive an ultrasonic wave; and
a plurality of dummy piezoelectric elements that are provided at second discrete positions on the second surface of the vibrating plate,
the manufacturing method comprising:
preparing the substrate;
forming the vibrating plate on one surface of the substrate;
forming the plurality of piezoelectric elements and the plurality of dummy piezoelectric elements on the vibrating plate;
forming an etching mask on the other surface, which is opposite to one surface, of the substrate, the etching mask being laterally shifted from the discrete positions on the XY plane; and
etching the substrate from the other surface of the substrate so that the plurality of spaces are formed,
wherein at least some of the plurality of spaces are arranged in a zigzag pattern relative to one another,
wherein the substrate has a plurality of partitions, and the plurality of spaces and the plurality of partitions are alternatively arranged in at least one of the X-axis direction and the Y-axis direction,
the second discrete positions correspond to the plurality of partitions, and
one of the plurality of dummy piezoelectric elements is sandwiched by two adjacent elements of the plurality of piezoelectric elements in at least one of the X-axis direction and the Y-axis direction.

6. The ultrasonic sensor according to claim 1,
wherein the plurality of spaces formed in the substrate in a plurality of the X-axis directions along the X axis and a plurality of the Y-axis directions along the Y axis, and each of the plurality of spaces has the same size in the plan view,
a first space is located on a first X-axis direction of the plurality of the X-axis directions, a second space is located on a second X-axis direction of the plurality of the X-axis directions, the first and second X-axis directions are directly adjacent to each other, and
a distance in the X-axis direction between a first line in the Y-axis direction passing a center of the first space and a second line in the Y-axis direction passing a center of the second space is longer than a length in the X-axis direction of each of the first and second spaces.

* * * * *